(12) United States Patent
Thie et al.

(10) Patent No.: US 9,997,364 B2
(45) Date of Patent: Jun. 12, 2018

(54) HIGH ASPECT RATIO ETCH

(71) Applicant: Lam Research Corporation, Fremont, CA (US)

(72) Inventors: William Thie, Fremont, CA (US); Jisoo Kim, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 0 days. days.

(21) Appl. No.: 15/298,098

(22) Filed: Oct. 19, 2016

(65) Prior Publication Data

US 2018/0108531 A1 Apr. 19, 2018

(51) Int. Cl.
*B44C 1/22* (2006.01)
*H01L 21/3065* (2006.01)
*H01J 37/32* (2006.01)

(52) U.S. Cl.
CPC ...... *H01L 21/3065* (2013.01); *H01J 37/3244* (2013.01); *H01J 37/32082* (2013.01); *H01J 2237/334* (2013.01)

(58) Field of Classification Search
CPC ..... H01L 21/30655; H01L 2224/11916; H01L 39/247
USPC ........... 216/67; 438/695, 699, 702, 703, 734
See application file for complete search history.

(56) References Cited

U.S. PATENT DOCUMENTS

| | | | |
|---|---|---|---|
| 6,358,859 B1 | 3/2002 | Lo et al. | |
| 6,465,043 B1* | 10/2002 | Gupta | C23C 16/402 427/255.28 |
| 7,767,584 B1 | 8/2010 | Singh et al. | |
| 9,129,902 B2 | 9/2015 | Lee et al. | |
| 9,396,961 B2 | 7/2016 | Arghavani et al. | |
| 2005/0136682 A1* | 6/2005 | Hudson | H01L 21/31116 438/714 |
| 2007/0074968 A1 | 4/2007 | Vukovic | |

(Continued)

FOREIGN PATENT DOCUMENTS

JP 2012-169493 9/2012

OTHER PUBLICATIONS

International Search Report from International Application No. PCT/US2017/055297 dated Jan. 24, 2018.

(Continued)

*Primary Examiner* — Binh X Tran
(74) *Attorney, Agent, or Firm* — Beyer Law Group LLP

(57) ABSTRACT

A method for etching a layer in a processing chamber is provided. A plurality of cycles is provided, where each cycle comprises a deposition phase, a clearing phase, and an etching phase. The deposition phase comprises flowing a deposition gas comprising a fluorocarbon or hydrofluorocarbon gas into the processing chamber, maintaining a deposition phase pressure of at least 50 mTorr, transforming the deposition gas into a plasma, and stopping the deposition phase. The clearing phase comprises flowing a clearing gas comprising a halogen containing gas into the processing chamber, maintaining a clearing phase pressure of less than 40 mTorr, transforming the clearing gas into a plasma, and stopping the clearing phase. The etching phase comprises flowing an etching gas comprising a halogen containing gas into the processing chamber, maintaining an etching phase pressure of at least 30 mTorr, transforming the etching gas into a plasma, and stopping the etching phase.

20 Claims, 8 Drawing Sheets

(56) References Cited

U.S. PATENT DOCUMENTS

| | | | |
|---|---|---|---|
| 2007/0281489 A1* | 12/2007 | Pandhumsoporn | B81C 1/00571 |
| | | | 438/710 |
| 2009/0242512 A1* | 10/2009 | Beaudry | H01L 21/30655 |
| | | | 216/49 |
| 2012/0309198 A1* | 12/2012 | Xu | H01L 21/30655 |
| | | | 438/702 |
| 2015/0011088 A1* | 1/2015 | McNie | C23C 16/52 |
| | | | 438/689 |
| 2015/0099367 A1 | 4/2015 | Kim et al. | |

OTHER PUBLICATIONS

Written Opinion from International Application No. PCT/US2017/055297 dated Jan. 24, 2018.

* cited by examiner

HIGH ASPECT RATIO ETCH

BACKGROUND

The present disclosure relates to the manufacturing of semiconductor devices. More specifically, the disclosure relates to the etching layers of a stack.

During semiconductor wafer processing, features may be etched in a layer of a stack. High aspect ratio etches have a high ratio of feature depth to feature width.

SUMMARY

To achieve the foregoing and in accordance with the purpose of the present disclosure, a method for etching features into a layer in a processing chamber is provided. A plurality of cycles is provided, where each cycle comprises a deposition phase, a clearing phase, and an etching phase. The deposition phase comprises flowing a deposition gas comprising a fluorocarbon or hydrofluorocarbon gas into the processing chamber, maintaining a deposition phase pressure of at least 50 mTorr, transforming the deposition gas into a plasma, and stopping the deposition phase. The clearing phase comprises flowing a clearing gas comprising a halogen containing gas into the processing chamber, maintaining a clearing phase pressure of less than 40 mTorr, transforming the clearing gas into a plasma, and stopping the clearing phase. The etching phase comprises flowing an etching gas comprising a halogen containing gas into the processing chamber, maintaining an etching phase pressure of at least 30 mTorr, transforming the etching gas into a plasma, and stopping the etching phase.

These and other features of the present disclosure will be described in more detail below in the detailed description of the disclosure and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE PREFERRED EMBODIMENTS

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

Figure 1:
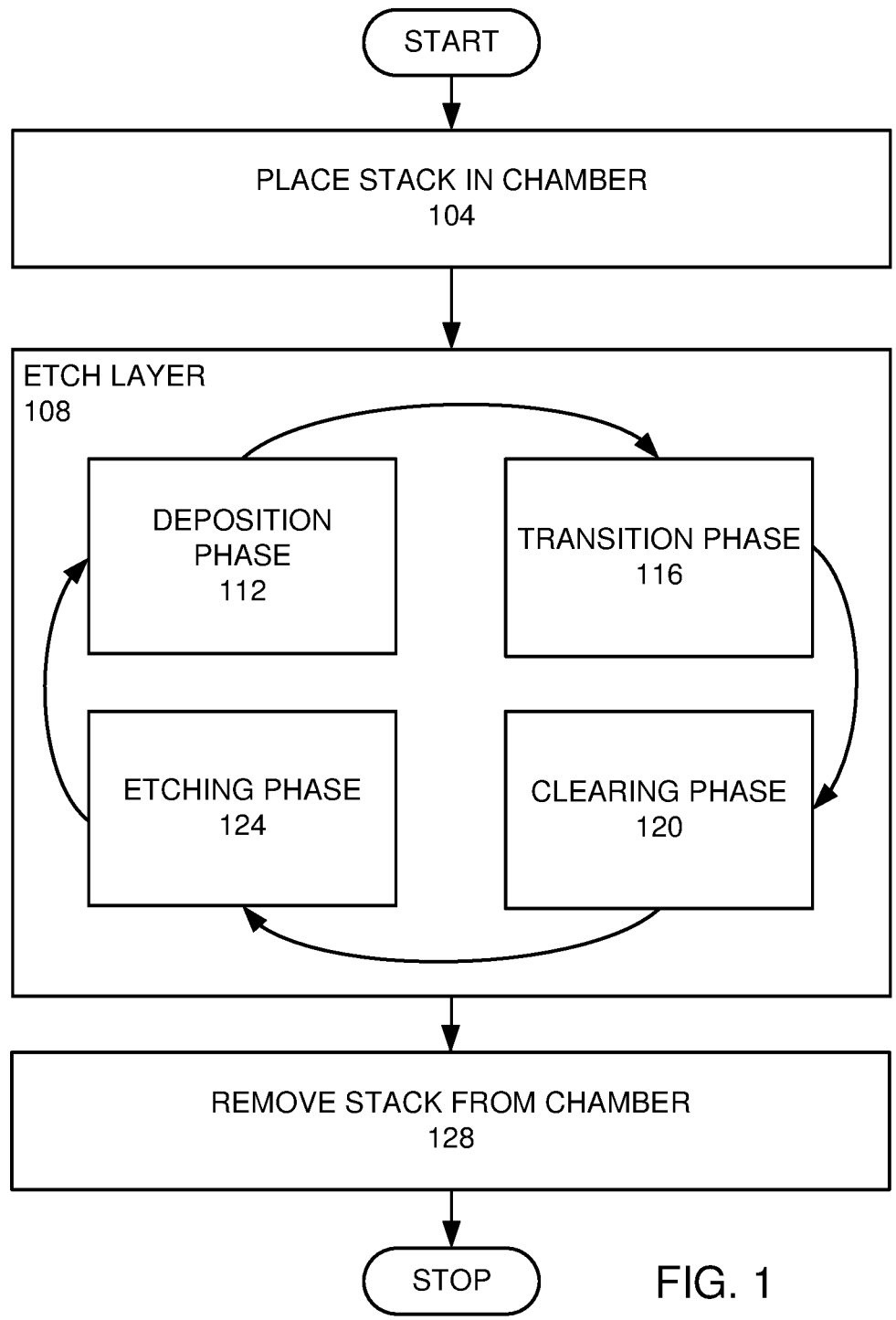
FIG. 1 is a high level flow chart of an embodiment.

To facilitate understanding, FIG. 1 is a high level flow chart of a process used in an embodiment. A stack with a layer is placed in a plasma processing chamber (step 104). The layer is etched (step 108), using a process that comprises a plurality of cycles, where each cycle comprises a deposition phase (step 112), a transition phase (step 116), a clearing phase (step 120), and an etching phase (step 124). The stack with the etched layer is removed from the plasma processing chamber (step 128).

EXAMPLES

Figure 2A:
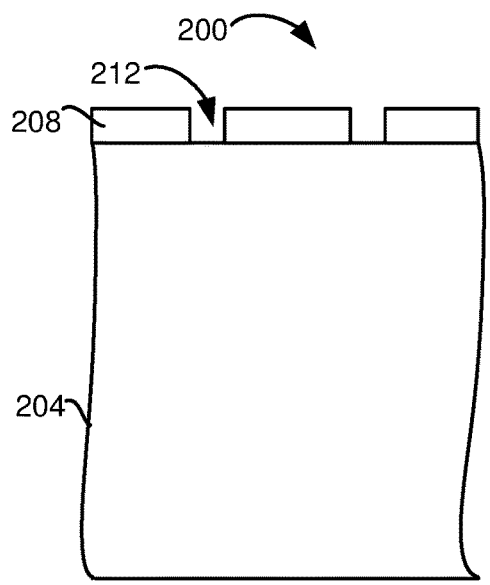
FIGS. 2A-B are schematic views of a stack processed according to an embodiment.

In an example of a preferred embodiment, a stack with a layer is placed into a plasma processing chamber (step 104). FIG. 2A is a cross-sectional view of a stack 200 with a silicon containing etch layer 204 disposed below a mask 208 with mask features 212. In this example, the etch layer 204 is a silicon wafer. In other embodiments, the etch layer may be a silicon or polysilicon layer formed above a silicon wafer.

Figure 3:
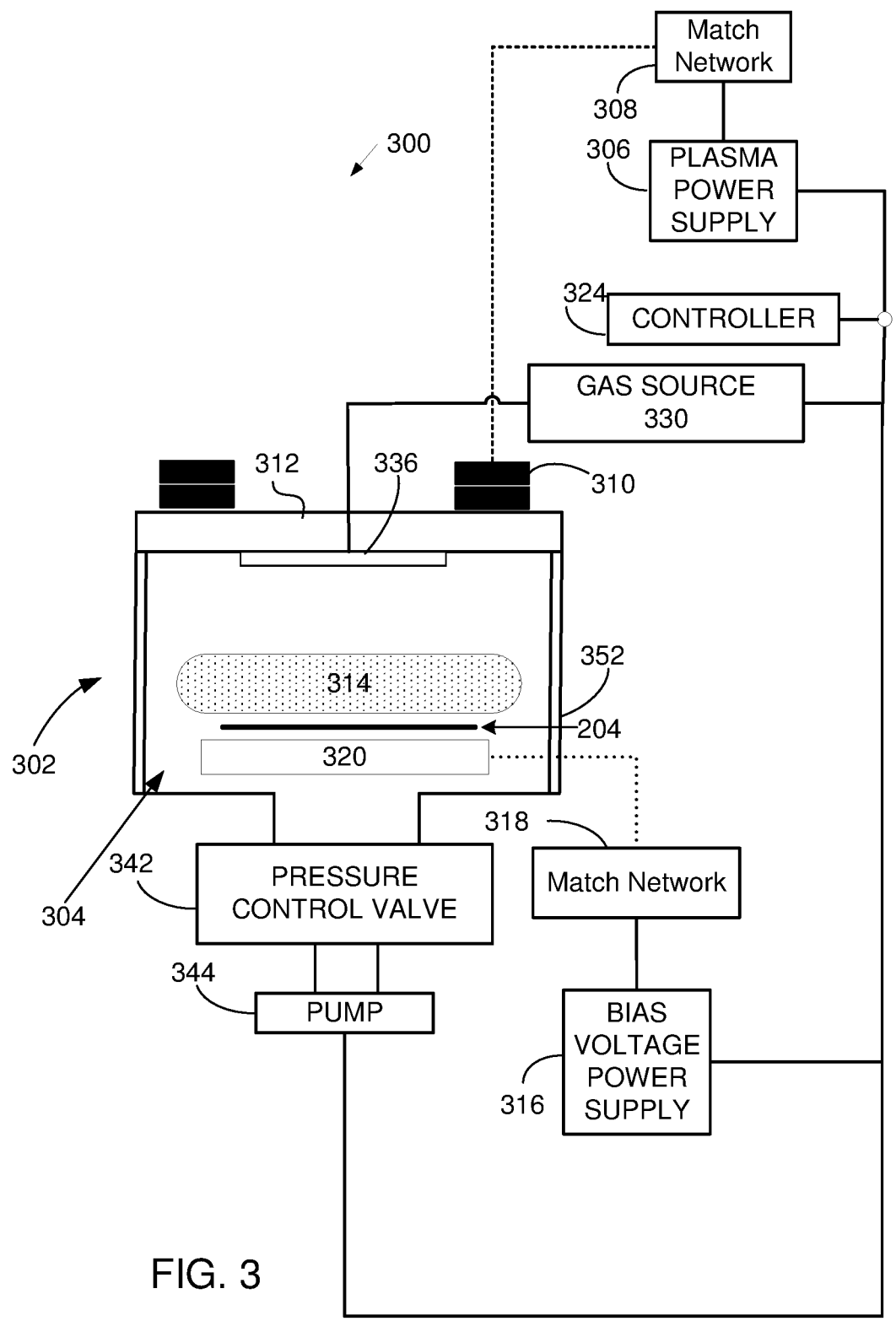
FIG. 3 is a schematic view of an etch reactor that may be used for etching.

In one embodiment, all processing may be performed in a single plasma etch chamber. FIG. 3 schematically illustrates an example of a plasma processing system 300 which may be used to etch the etch layer 204 in accordance with one embodiment of the present disclosure. The plasma processing system 300 includes a plasma reactor 302 having a plasma processing chamber 304, enclosed by a chamber wall 352. A plasma power supply 306, tuned by a match network 308, supplies power to a TCP coil 310 located near a power window 312 to create a plasma 314 in the plasma processing chamber 304 by providing an inductively coupled power. The TCP coil (upper power source) 310 may be configured to produce a uniform diffusion profile within the plasma processing chamber 304. For example, the TCP coil 310 may be configured to generate a toroidal power distribution in the plasma 314. The power window 312 is provided to separate the TCP coil 310 from the plasma processing chamber 304 while allowing energy to pass from the TCP coil 310 to the plasma processing chamber 304. A wafer bias voltage power supply 316 tuned by a match network 318 provides power to an electrode 320 to set the bias voltage on the etch layer 204 which is supported over the electrode 320. A controller 324 sets points for the plasma power supply 306 and the wafer bias voltage power supply 316.

The plasma power supply 306 and the wafer bias voltage power supply 316 may be configured to operate at specific radio frequencies such as, 13.56 MHz, 27 MHz, 2 MHz, 400 kHz, or combinations thereof. Plasma power supply 306 and wafer bias voltage power supply 316 may be appropriately sized to supply a range of powers in order to achieve desired process performance. For example, in one embodiment, the plasma power supply 306 may supply the power in a range of 50 to 5000 Watts, and the wafer bias voltage power supply 316 may supply a bias voltage of in a range of 20 to 2000 V. In addition, the TCP coil 310 and/or the electrode 320 may be comprised of two or more sub-coils or sub-electrodes, which may be powered by a single power supply or powered by multiple power supplies.

As shown in FIG. 3, the plasma processing system 300 further includes a gas source/gas supply mechanism 330. The gas source/gas supply mechanism 330 provides gas to a gas feed 336 in the form of a shower head. The process gases and byproducts are removed from the plasma processing chamber 304 via a pressure control valve 342 and a pump 344, which also serve to maintain a particular pressure within the plasma processing chamber 304. The gas source/gas supply mechanism 330 is controlled by the controller 324. A Kiyo by Lam Research Corp. of Fremont, Calif., may be used to practice an embodiment.

Figure 4:
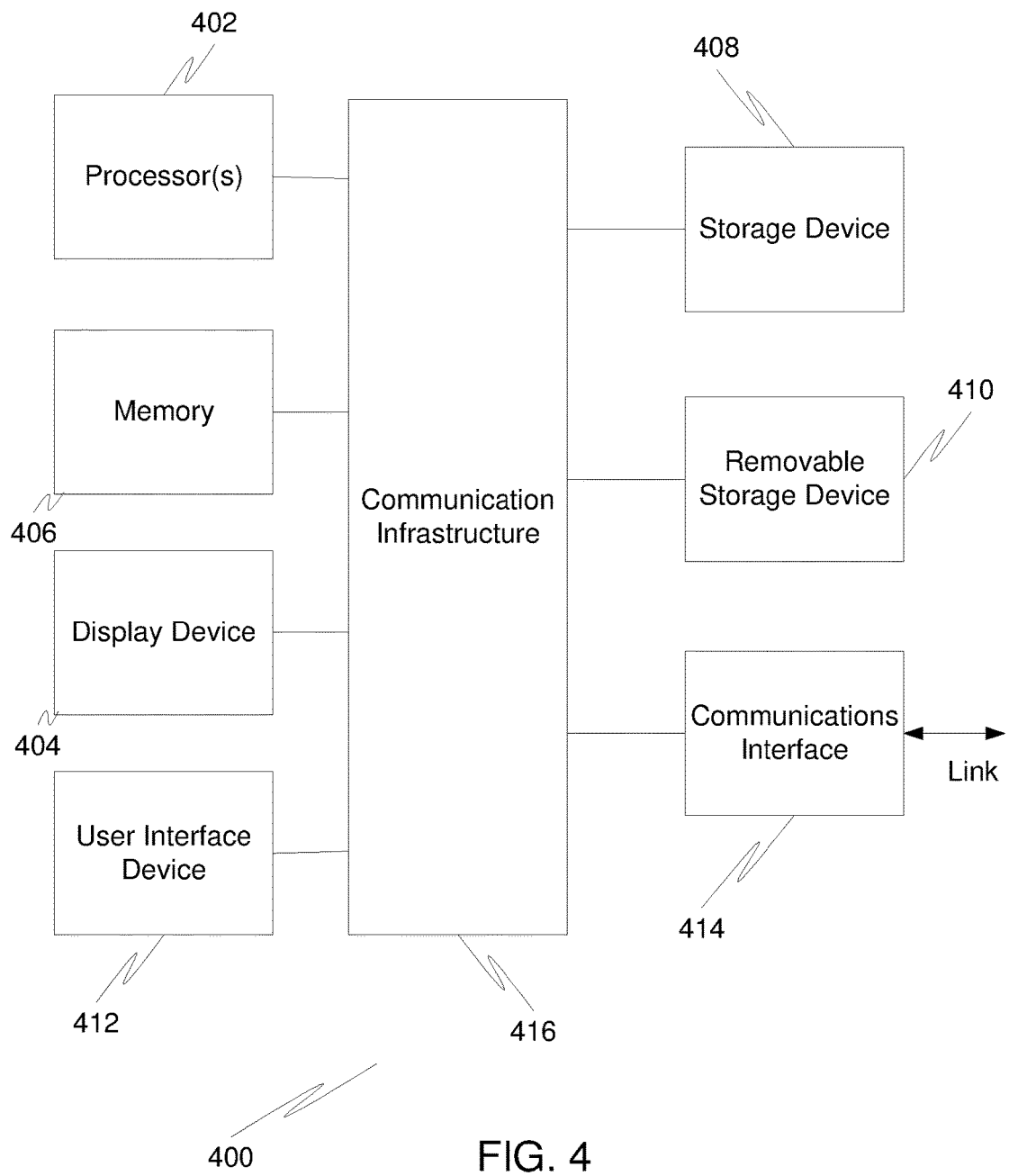
FIG. 4 illustrates a computer system, which is suitable for implementing a controller used in embodiments.

FIG. 4 is a high level block diagram showing a computer system 400, which is suitable for implementing a controller 324 used in embodiments. The computer system may have many physical forms ranging from an integrated circuit, a printed circuit board, and a small handheld device up to a huge super computer. The computer system 400 includes one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communication interface 414 (e.g., wireless network interface). The communication interface 414 allows software and data to be transferred between the computer system 400 and external devices via a link. The system may also include a communications infrastructure 416 (e.g., a communications bus, cross-over bar, or network) to which the aforementioned devices/modules are connected.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments may execute solely upon the processors or may execute over a network, such as the Internet, in conjunction with remote processors that share a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

The layer is etched (step 108), using a process that comprises a plurality of cycles, where each cycle comprises a deposition phase (step 112), a transition phase (step 116), a clearing phase (step 120), and an etching phase (step 124). In this example, the cycle begins with the deposition phase (step 112). In other embodiments, the cycle may begin with another phase, such as the clearing phase or etching phase.

Figure 5:
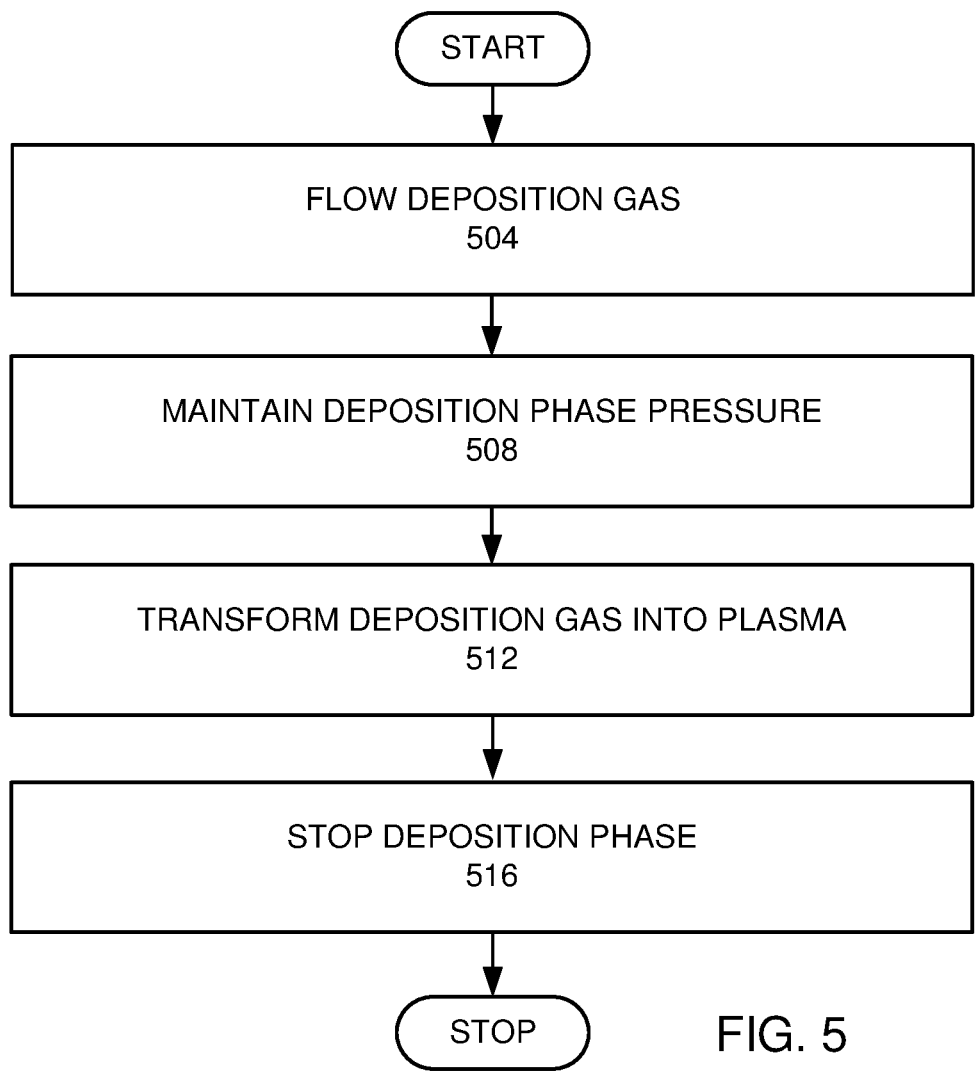
FIG. 5 is a more detailed flow chart of a deposition phase.

FIG. 5 is a more detailed flow chart of the deposition phase (step 112). A deposition gas is flowed into the processing chamber (step 504). In this example, the deposition gas comprises a fluorocarbon or hydrofluorocarbon gas. For example, the deposition gas is 300 sccm $C_4F_8$. The chamber pressure is maintained at a deposition phase pressure (step 508). Preferably, the deposition phase pressure is at least 50 mTorr. In this example, the deposition phase pressure is 180 mTorr. The deposition gas is transformed into a plasma (step 512). In this example, 2000 Watts of TCP power is provided at 13.56 MHz, which transforms the deposition gas into a plasma. A bias voltage of 100 volts is provided. After about 2 seconds, the deposition phase is stopped (step 516). This may be done by stopping the flow of the deposition gas.

Figure 6:
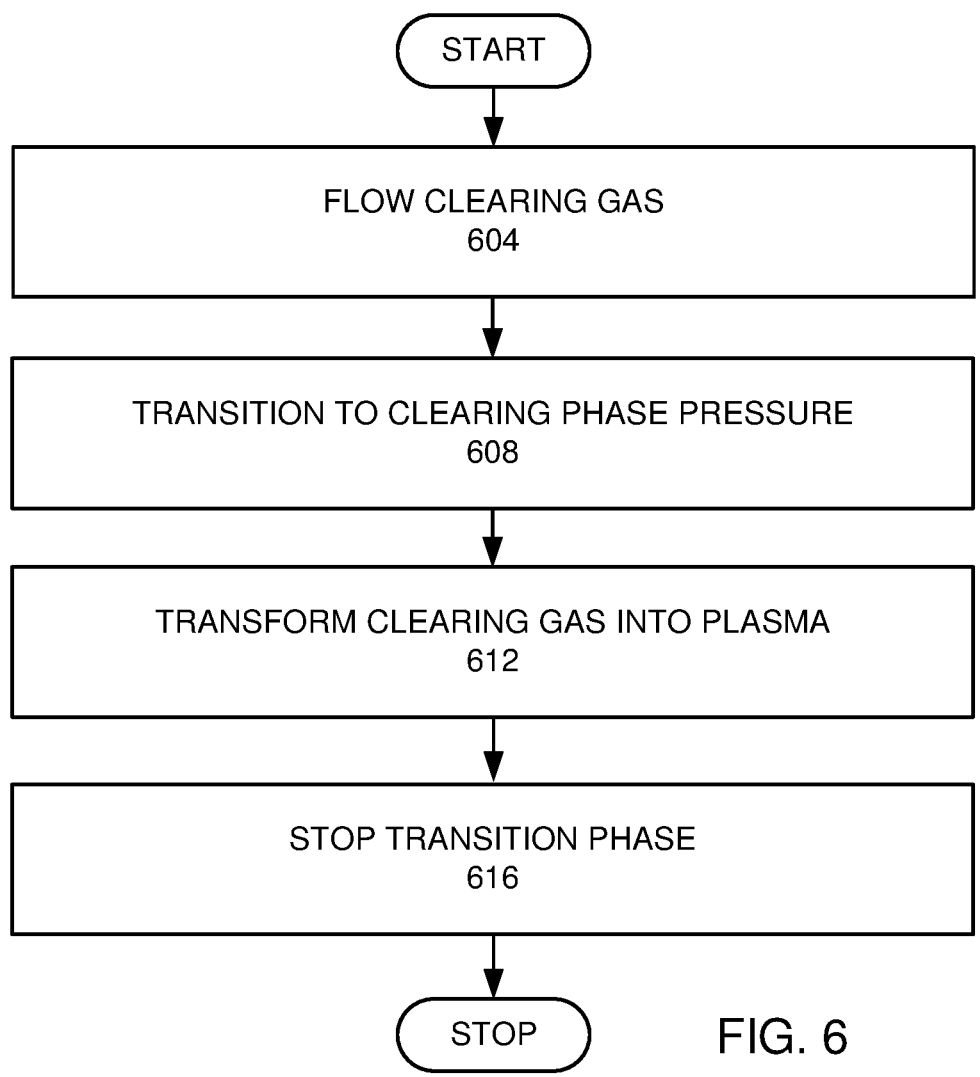
FIG. 6 is a more detailed flow chart of a transition phase.

FIG. 6 is a more detailed flow chart of the transition phase (step 116). A clearing gas is flowed into the processing chamber (step 604). In this example, the clearing gas comprises a halogen containing gas. For example, the clearing gas is 120 sccm $SF_6$. The chamber pressure is transitioned from the deposition phase pressure to the clearing phase pressure (step 608). Preferably, the transition is from a deposition phase pressure of at least 50 mTorr to a clearing phase pressure of less than 40 mTorr. In this example, the transition is from a pressure of 100 mTorr to a pressure of 25 mTorr. The clearing gas is transformed into a plasma (step 612). In this example, 300 Watts of TCP power is provided at 13.56 MHz, which transforms the clearing gas into a plasma. No bias voltage is provided. After about 0.5 seconds, the transition phase is stopped (step 616). This may be done by increasing the TCP power to provide the clearing phase.

Figure 7:
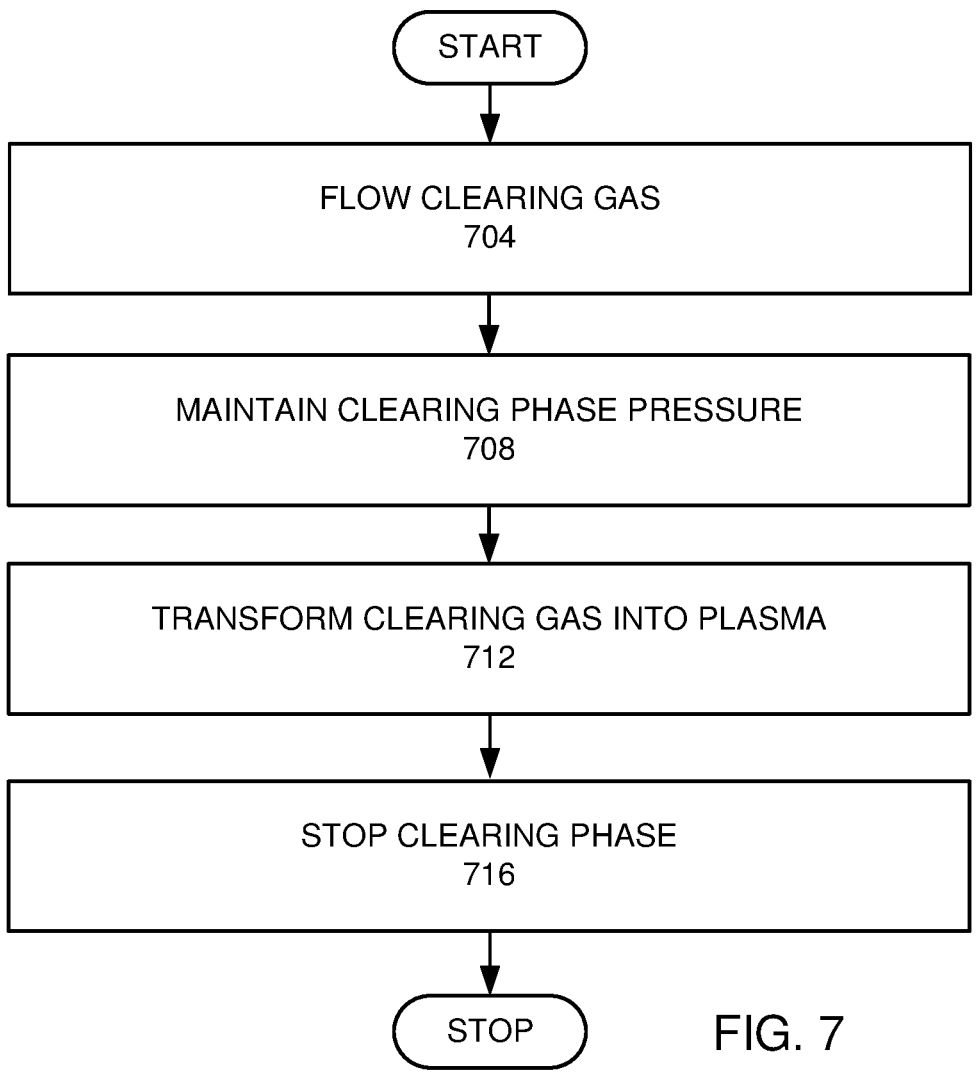
FIG. 7 is a more detailed flow chart of a clearing phase.

FIG. 7 is a more detailed flow chart of the clearing phase (step 120). The clearing gas is continued to be flowed into the processing chamber (step 704). In this example, the clearing gas comprises a halogen containing gas. For example, the clearing gas is 120 sccm $SF_6$. The chamber pressure is maintained at the clearing phase pressure (step 708). Preferably, the clearing phase pressure is less than 40 mTorr. In this example, the clearing phase pressure is a pressure of 25 mTorr. The clearing gas is transformed into a plasma (step 712). In this example, 1000 Watts of TCP power is provided at 13.56 MHz, which transforms the clearing gas into a plasma. A bias voltage of 250 volts is provided. After about 0.4 seconds, the clearing phase is stopped (step 716). This may be done by stopping the flow of the clearing gas.

Figure 8:
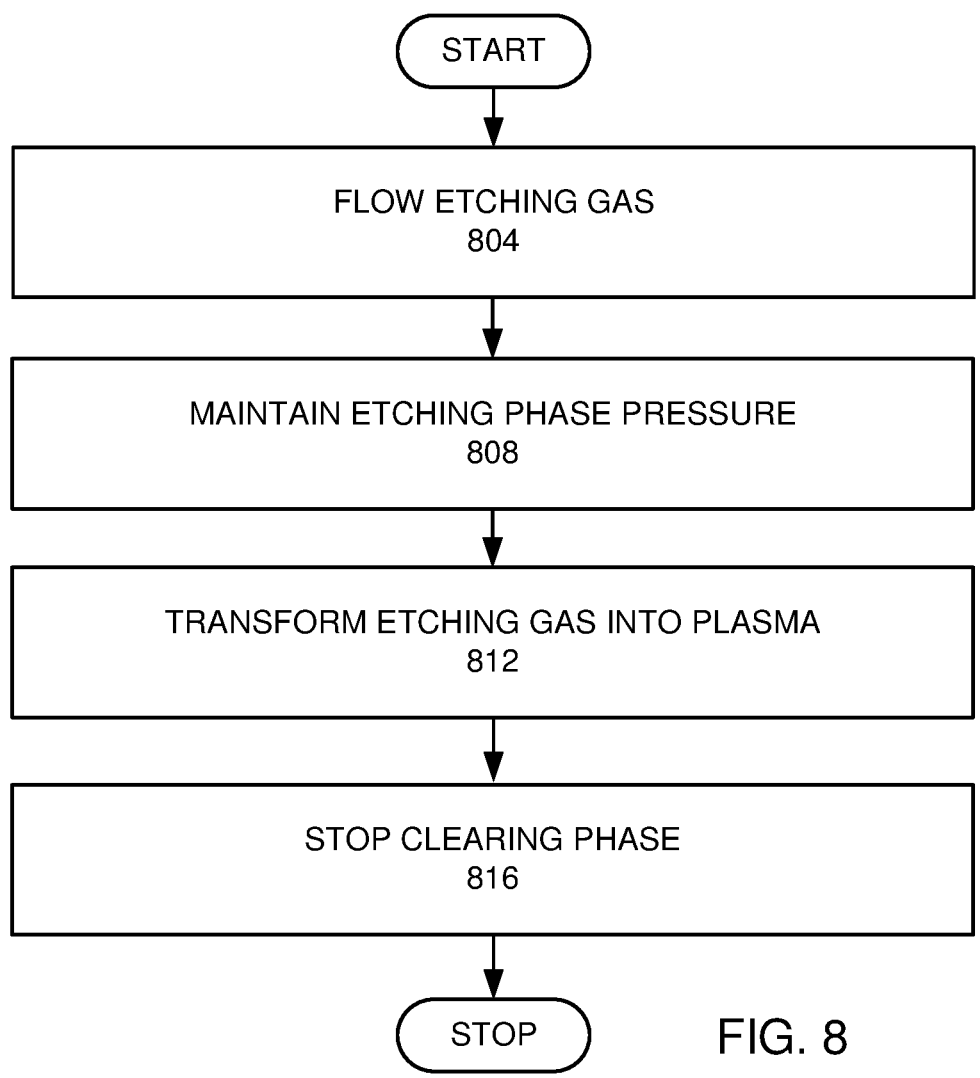
FIG. 8 is a more detailed flow chart of an etching phase.

FIG. 8 is a more detailed flow chart of the etching phase (step 124). An etching gas is flowed into the processing chamber (step 804). In this example, the etching gas comprises a halogen containing gas. For example, the etching gas is 120 sccm $SF_6$. The chamber pressure is maintained at an etching phase pressure (step 808). Preferably, the etching phase pressure is at least 30 mTorr. In this example, the etching phase pressure is a pressure of 42 mTorr. The etching gas is transformed into a plasma (step 812). In this example, 1000 Watts of TCP power is provided at 13.56 MHz, which transforms the etching gas into a plasma. A bias voltage of 100 volts is provided. After about 0.6 seconds, the etching phase is stopped (step 816). This may be done by stopping the flow of the etching gas.

Figure 2B:
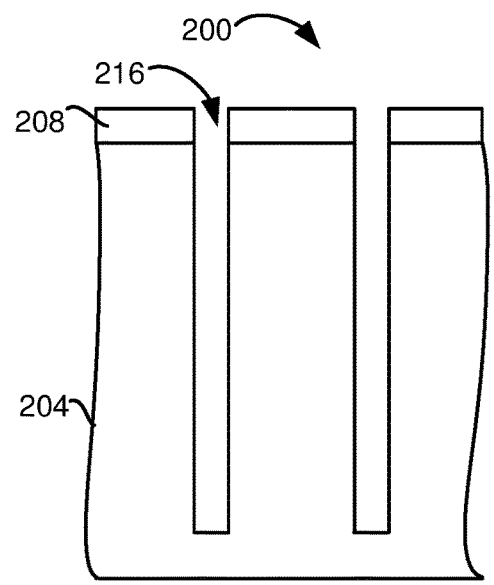

After a plurality of cycles, the etch process is completed. FIG. 2B is a cross-sectional view of a stack 200 after the etch process is completed. High aspect ratio features 216 are etched into the etch layer 204.

Preferably, the high aspect ratio features have a depth to width ratio of at least 20:1. Preferably, bowing is reduced and mask selectivity is increased. In this example, bowing may be eliminated. Preferably, the etching gas is hydrofluorocarbon and fluorocarbon free. Preferably, the clearing bias is greater than both the transition bias, the deposition bias, and the etching bias. Preferably, the etching bias and deposition bias are greater than the transition bias. More preferably, the transition bias is less than 100 volts, the etch bias is no more than 100 volts, the deposition bias is less than 200 volts and the clearing bias is greater than 100 volts. More preferably, the deposition bias is no more than 100 volts. More preferably, the clearing phase has a bias between 150 to 500 volts.

In some embodiments, an intercycle ramping may be provided. For example, for the clearing phase the bias may be ramped from 150 volts to 300 volts over 200 cycles. During the first cycle, the clearing phase would have a bias of 150 volts. Each subsequent clearing phase in subsequent cycles would have a higher bias, until the 200$^{th}$ cycle, where the clearing phase has a bias of 300 volts. In another example, the etching phase pressure may ramp from 30 mTorr for the first cycle to 42 mTorr for the last cycles.

The deposition phase at a high pressure in the embodiment selectively deposits polymer on the tops of the mask and features with respect to the bottoms of the features. The transition phase allows for the lowering of pressure from the deposition phase to the clearing phase. The initial flowing of the clearing gas may provide a pressure pulse that may further initially increase pressure. Performing the clearing phase at an initial high pressure has been unexpectedly found to increase blow out. The clearing phase at a low pressure selectively removes deposited polymer at bottoms of the features with respect to depositions on tops of the features or on sidewalls of the features. The etch phase etches bottoms of the features, while depositions on the sidewalls and tops of the features protect the mask and sidewalls of the features.

Preferably, the transition phase is for a period of between 50 msec to 1 second, and the clearing phase is for a period between 150 msec to 800 msec. More preferably, the deposition phase is provided for a period of between 0.3 to 2.5 seconds, the transition phase is provided for a period of about 0.5 seconds, the clearing phase is provided for a period between 0.3 seconds and 0.5 seconds, and the etching phase is provided for a period between 0.3 seconds and 0.8 seconds.

Preferably, the deposition phase pressure is greater than 50 mTorr. More preferably, the deposition phase pressure is greater than 80 mTorr.

In various embodiments, the deposition phase deposits a polymer to protect the mask and prevent blowout. A high deposition pressure has been found to more selectively deposit at the top, allowing more selective deposition on the mask to improve etch selectivity, with respect to the mask and more deposition near the top of the features to reduce or eliminate blow out. Selective deposition near the top results in less deposition near the bottom of the features, so that less clearing is required to remove polymer near the bottom of the features. The clearing phase uses a low pressure and high bias to selectively remove polymer from the bottoms of the features with respect to the tops of the features. To provide features with a CD below 100 nm, a pressure of less than 30 mTorr is needed during the clearing. The low pressure and high bias of the clearing phase provide highly directional ions to clear polymer at the bottom of the features without clearing polymer on the sidewalls, to prevent bow out caused by etching the sidewalls. The etch phase has a pressure greater than the clearing phase pressure and a low bias of less than 100 volts. Such parameters provide a more isotropic etch compared to the selective clearing in the clearing phase. Without a transition phase, a pressure pulse may be caused by the initial flowing of the clearing gas. It is believed that a high bias at a high pressure with the clearing gas formed into a plasma increases blow out and reduces mask selectivity.

Some embodiments may not have a transition phase. Such embodiments would need a bypass or other device or method to avoid a pressure pulse from beginning the flow of the clearing gas.

In various embodiments, the endpoint of the transition phase may be either predetermined or determined by a sensor. If the endpoint is determined by a sensor, an endpoint sensor may be an optical endpoint sensor or a pressure gauge, which may measure the pressure every 10 msec, or another type of plasma diagnostic sensor. The transition phase may end when the pressure stabilizes and/or when a change in gas chemistry is detected using an optical endpoint sensor. In other embodiments, modeling or other methods may be used to predetermine the endpoint.

It has been found that embodiments allow a transition between two of the phases that comprises a pressure swing rate of greater than 50 mTorr/sec or 0.2 mTorr/(sec*sccm). Allowing such a pressure swing provides greater throughput, while providing a high aspect ratio etch without blow out.

While this disclosure has been described in terms of several preferred embodiments, there are alterations, permutations, modifications, and various substitute equivalents, which fall within the scope of this disclosure. It should also be noted that there are many alternative ways of implementing the methods and apparatuses of the present disclosure. It is therefore intended that the following appended claims be interpreted as including all such alterations, permutations, and various substitute equivalents as fall within the true spirit and scope of the present disclosure.

What is claimed is:

1. A method of etching a layer placed in a processing chamber, comprising providing a plurality of cycles, wherein each cycle comprises:
a deposition phase to selectively deposit polymer on the tops of mask features of the layer with respect to the bottoms of the mask features, comprising
flowing a deposition gas comprising a fluorocarbon or hydrofluorocarbon gas into the processing chamber;
maintaining a deposition phase pressure of at least 50 mTorr;
transforming the deposition gas into a plasma; and
stopping the deposition phase;
a clearing phase, after the deposition phase, comprising:
flowing a clearing gas comprising a halogen containing gas into the processing chamber;
maintaining a clearing phase pressure of less than 40 mTorr;
transforming the clearing gas into a plasma; and
stopping the clearing phase; and
an etching phase, after the clearing phase, comprising:
flowing an etching gas comprising a halogen containing gas into the processing chamber;
maintaining an etching phase pressure of at least 30 mTorr;
transforming the etching gas into a plasma; and
stopping the etching phase.

2. The method, as recited in claim 1, wherein the deposition phase pressure is at least 80 mTorr.

3. The method, as recited in claim 1, wherein the halogen containing gas, in at least one of the clearing phase and the etching phase, is a fluorine containing gas.

4. The method, as recited in claim 1, wherein the clearing gas and etching gas are fluorocarbon and hydrofluorocarbon free.

5. The method, as recited in claim 1, wherein the clearing phase is provided for a period between 0.3 seconds and 0.5 seconds.

6. The method, as recited in claim 1, further comprising a transition phase after the deposition phase and before the clearing phase, wherein the transition phase comprises:
flowing the clearing gas into the processing chamber; and
stopping the transition phase upon an end point condition.

7. The method, as recited in claim 6, wherein the transition phase further comprises determining an endpoint of the transition phase.

8. The method, as recited in claim 7, wherein the endpoint of the transition phase is determined by measuring at least one of chamber pressure, emission spectrum, absorption spectrum, and interferometry.

9. The method, as recited in claim 6, wherein the transition phase further comprises a transition bias of less than 100 volts.

10. The method, as recited in claim 9, wherein the transition phase further comprises providing a TCP power less than 500 Watts to the processing chamber.

11. The method, as recited in claim 9, wherein the clearing gas and etching gas are fluorocarbon and hydrofluorocarbon free.

12. The method, as recited in claim 11, wherein the deposition phase further comprises providing a deposition bias, and wherein the transition phase further comprises providing a transition bias voltage, and wherein the clearing phase further comprises providing a clearing bias voltage greater than the transition bias voltage, and wherein the etching phase comprises providing an etching bias voltage which is less than or equal to the clearing bias voltage.

13. The method, as recited in claim 12, wherein the transition bias voltage is less than 100 volts, the deposition bias voltage is less than 200 volts, the clearing bias voltage is greater than 100 volts, and the etching bias voltage is no more than 100 volts.

14. The method, as recited in claim 12, wherein the halogen containing gas is a fluorine containing gas.

15. The method, as recited in claim 14, further comprising determining an endpoint of the transition phase.

16. The method, as recited in claim 15, wherein the endpoint of the transition phase is determined by measuring at least one of chamber pressure, emission spectrum, absorption spectrum, and interferometry.

17. The method, as recited in claim 15, wherein the transition phase endpoint is predetermined.

18. The method, as recited in claim 17, wherein the transition phase is for a period between 50 msec and 1 sec.

19. A method of etching a layer placed in a processing chamber, comprising providing a plurality of cycles, wherein each cycle comprises:
a deposition phase to selectively deposit polymer on the tops of mask features of the layer with respect to the bottoms of the mask features, comprising
flowing a deposition gas comprising a fluorocarbon or hydrofluorocarbon gas into the processing chamber;
maintaining a deposition phase pressure of at least 50 mTorr;
transforming the deposition gas into a plasma; and
stopping the deposition phase;
a clearing phase to selectively remove deposited polymer at the bottoms of the mask features, comprising:
flowing a clearing gas comprising a halogen containing gas into the processing chamber;
maintaining a clearing phase pressure of less than 40 mTorr;
transforming the clearing gas into a plasma; and
stopping the clearing phase; and
an etching phase to etch the bottoms of the mask features that have been cleared by the clearing phase, comprising:
flowing an etching gas comprising a halogen containing gas into the processing chamber;
maintaining an etching phase pressure of at least 30 mTorr;
transforming the etching gas into a plasma; and
stopping the etching phase.

20. A method of etching a layer placed in a processing chamber, comprising providing a plurality of cycles, wherein each cycle comprises:
a deposition phase to selectively deposit polymer on the tops of mask features of the layer with respect to the bottoms of the mask features, comprising
flowing a deposition gas comprising a fluorocarbon or hydrofluorocarbon gas into the processing chamber;
maintaining a deposition phase pressure of at least 50 mTorr;
transforming the deposition gas into a plasma; and
stopping the deposition phase;
a transition phase after the deposition phase to transition from the deposition phase pressure of at least 50 mTorr to flow a clearing gas with a clearing base pressure of less than 30 mTorr;
a clearing phase after the transition phase to selectively remove deposited polymer at the bottoms of the mask features, comprising:
flowing the clearing gas comprising a halogen containing gas into the processing chamber;
maintaining a clearing phase pressure of less than 30 mTorr;
transforming the clearing gas into a plasma; and
stopping the clearing phase; and
an etching phase after the clearing phase to etch the bottoms of the mask features, comprising:
flowing an etching gas comprising a halogen containing gas into the processing chamber;
maintaining an etching phase pressure of at least 30 mTorr;
transforming the etching gas into a plasma; and
stopping the etching phase.

* * * * *